United States Patent [19]

Geballe et al.

[11] Patent Number: 5,070,071

[45] Date of Patent: Dec. 3, 1991

[54] METHOD OF FORMING A CERAMIC SUPERCONDUCTING COMPOSITE WIRE USING A MOLTEN POOL

[75] Inventors: Theodore H. Geballe, Woodside; Robert S. Feigelson, Saratoga; Dan Gazit, Palo Alto, all of Calif.

[73] Assignee: The Board of Trustees of the Leland Stanford Junior University, Stanford, Calif.

[21] Appl. No.: 255,792

[22] Filed: Oct. 11, 1988

[51] Int. Cl.$^5$ .......................... B05D 5/12; B05D 1/18
[52] U.S. Cl. .................................. 505/1; 505/733; 505/740; 505/704; 427/62; 427/53.1; 427/434.6; 427/434.2; 427/435; 427/117
[58] Field of Search ............... 427/62, 63, 117, 53.1, 427/434.6, 434.2, 435; 505/1, 818, 819, 740, 704, 739, 733

[56] References Cited

FOREIGN PATENT DOCUMENTS 52-18195  2/1971  Japan .
60-177171 9/1985  Japan ............................ 427/434.6
63-109148 5/1988  Japan ............................ 427/434.6

OTHER PUBLICATIONS

Hoshino et al., "Preparation of Superconducting Bi-Sr-Ca-Cu-O Printed Thick Films on MgO Substrate and Agmetal Tape", Jpn. J. Appl. Phys., vol. 27(7), Jul. 1988, L1297-1299.
Hatta et al., "Pt-Coated Substrate Effect on Oxide Superconductive Films in Low-Temperature Processing", Appl. Phys. Lett., 53(2), Jul. 1988, pp. 148-150.
Skumryev et al., "Physical Properties of Bi,Ca,Sr,Cu,Ox Superconductor Obtained by Rapid Quenching from the Melt", Physica C 152, May (1988), pp. 315-320.
Feigelson et al., "Superconducting Bi-Ca-Sr-Cu-O Fibers Grown by the Laser-Heated Pedestal Growth Method", Science, vol. 240, Jun. 1988, pp. 1642-1645.
Feigelson, "Pulling Optical Fibers", J. Crystal Growth, 79(1986), pp. 669-680.
Jin et al., "Fabricating of Dense $Ba_2YCu_3O_{7-\delta}$ Superconductor Wire by Molten Oxide Processing", Appl. Phys. Lett., 51(12), Sep. 1987, pp. 943-945.
Maeda et al., "A New High-$T_c$ Oxide Superconductor Without A Rare Earth Element", Jpn. J. Appl. Phys., vol. 27(2), Feb. 1988, L209-210.
Perrin et al., "D.C. Sputtering Elaboration of Thin Films of the High $T_c$ Superconductor $YBa_2Cu_3O_{7-x}$", Revue Phys. Appl. 23, Mar. 1988, pp. 257-264.

*Primary Examiner*—Shrive Beck
*Assistant Examiner*—Roy V. King
*Attorney, Agent, or Firm*—Flehr, Hohbach, Test, Albritton & Herbert

[57] ABSTRACT

A method is provided for making a flexible superconductive composite wire by drawing a wire of noble metal through a melt formed from solid superconducting material. The preferred superconducting material comprises the Bi-Sr-Ca-Cu-O class of materials.

6 Claims, No Drawings

METHOD OF FORMING A CERAMIC SUPERCONDUCTING COMPOSITE WIRE USING A MOLTEN POOL

Support for this invention was provided by the Government pursuant to Contract No. DMR-87-21735 by the National Science Foundation. The Government has certain rights in this invention.

The present invention is directed to a method for making flexible superconductive composite wires comprising a metallic wire core and a superconductive coating.

BACKGROUND OF THE INVENTION

New classes of superconducting materials which take the form of ceramics, or mixed metal oxides, have been recently discovered, many of which exhibit superconductivity above the temperature of liquid nitrogen, 77°K, at ambient pressure. The discovery of these materials signifies the ability to prepare and maintain superconductive materials now in virtually any laboratory. These mixed metal oxides are typically made by sputtering appropriate metals and/or metal oxides onto a substrate and sintering to form the requisite ceramic structure. Another method involves coprecipitating the appropriate metals from aqueous solutions of their nitrate salts, then heating the precipitate at 900° C. to 950° C. to form the appropriate ceramic structure.

One of the problems, however, with these ceramic materials is that they are brittle, hard and difficult to handle without damaging the ceramic. This means that the mixed metal oxides are particularly difficult to form into wire or fiber, which might be useful for high-current applications. For small scale applications, such as for components in microcircuitry, the low current-carrying capacity requirements do not cause a problem since single crystal ceramics may suffice. However, the technology for making large single crystals suitable for high-current industrial uses is not yet practically available.

It is therefore an object of the present invention to provide a method of producing a superconductive composite wire which is flexible and which need not be in the form of a single crystal. This and other objects of the present invention will be apparent from the following description of the preferred embodiment of the invention, the appended claims, and from the practice of the invention.

SUMMARY OF THE INVENTION

The present invention provides a method for making flexible superconductive composite wire comprising the steps of drawing a wire of noble metal, or other suitable flexible substrate material capable of adhering to metal oxides, through a melt of Bi-Sr-Ca-Cu-O, or other superconductive mixed metal oxide, to coat the wire; and solidifying the coating by cooling. The present invention is further directed to flexible superconductive composite wires made by this process.

DESCRIPTION OF THE PREFERRED EMBODIMENTS

The present invention is directed to a method for making flexible superconductive composite wires by drawing a wire of noble metal, or other suitable flexible substrate, through a melt which cools to form a coating having superconducting properties.

The metal wire will form the core of the flexible superconducting composite wire and it will be appreciated that, depending upon the ultimate intended use, wires of different diameters may be utilized. Since the superconducting properties are in the coating, the wire is essentially a substrate which provide flexibility to the composite. The coatings on the wires, once solidified, will generally have a thickness in the range of about 2-100 microns, preferably in the range of 5-10 microns. The useful thickness of the coating is only limited by the degree of bending which is intended for the composite since, when the bending limits of the composite are exceeded, the coating will crack.

The composition of the wire core may be that of any metal, alloy or other suitable flexible substrate capable of adhering to metal oxides. Noble metals are particularly preferred. The term noble metal encompasses any metal which is not readily oxidized at the process temperature, particularly when heated in atmospheric environment. Such metals include, but at not limited to, platinum, iridium, rhodium, gold or other suitable materials. Preferred wires comprise platinum, rhodium, iridium and alloys thereof.

Although the diameter of the metal wire is not critical to the invention, for practical purposes it is convenient to use wires having diameters in the range of 20-500 microns.

The melt is provided by heating a solid material which has the composition of a superconductor so that the melt, once resolidified, usually need not be further processed to provide the proper superconducting structure and stoichiometry. In some instances, the solidified superconductive material will be subsequently heated to a suitable annealing temperature. For the Bi-Sr-Ca-Cu-O superconductors, however, such annealing is not required.

The superconductive coating according to the present invention will comprise one of the mixed-metal oxide superconductors, preferably Bi-Sr-Ca-Cu-O, formed first by mixing the oxides, $Bi_2O_3$, $CaCO_3$, $SrCO_3$, $CuO$ or other suitable oxides, grinding them into powder, pressing the finely ground powders into pellets, typically under pressures of 20,000 psi, and sintering the pellets in air at a temperature in the range of 750°-850° C. for about 10-20 hours. Preferably, the sintering conditions will be about 15 hours at a temperature of about 780° C. Alternatively, the pellets may be formed by hot pressing at about 700° C. under about 7,000 psi in a copper-lined die. The concentrations of the powders in the mixture are not critical in achieving the proper superconducting Bi-Sr-Ca-Cu-O composition. It is preferable, but not necessary, in order to minimize the presence of islands of material having improper composition, to regrind the pellets at least once, repress the powder into pellets, and to sinter again under the same conditions. This solid material having the proper composition for a superconducting material, i.e., $Bi_2Sr_2CaCuO_{8-\delta}$ or $Bi_{1.8}Sr_{1.8}Ca_{1.2}Cu_{2.2}O_{8-\delta}$ wherein $\delta$ is a variable number, and is not necessarily an integer, will then be heated to form a melt through which the noble metal wire is pulled and coated. It is desirable that the liquid pool be as small as possible so as to only comprise sufficient liquid to completely coat the wire as it is drawn through the pool. Thus, preferably a small band of the solid material will be exposed to the heat source (preferably a laser) so that the solid is gradually melted from one end. The energy source for melting the solid material should be accurately focused and therefore it is preferred that a focused laser beam be used, such as described in *Science*, 240 1642-45 (June 17, 1988), which provides energy sufficient to melt the solid material without deterioration of its chemical properties.

In one embodiment of the present method, the solid materials are pressed and sintered into square cross-sectioned rods. Two rods are grooved on one side, then placed cofacially to form a hole running along the longitudinal axis. Through this hole the noble metal wire is threaded. The rod is then held vertically and the top end of the rod is heated by a focused laser beam which forms a molten pool in the top of the rod through which the wire is then drawn.

In another embodiment, the wire is adjacent to and in contact with the rod on one surface. The top of the rod is then heated with the focused laser and the wire is drawn through the molten pool on the top surface at the desired rate.

In either embodiment, the rate at which the wire is drawn through the molten pool will control the thickness of the coating ultimately deposited onto the wire. The typical drawing rate of the wire through the pool will be less than about 25 millimeters of wire per hour. As the drawn wire leaves the molten pool and the influence of the laser, it cools naturally and the coating solidifies to form a composite according to the present invention.

A typical 100 micron diameter platinum wire drawn through a pool of Bi-Sr-Ca-CuO at the rate of 4.6 millimeters/hour was measured to show the onset of superconductivity at 90°K and a zero resistivity at 78°K in an 8 micron thick coating. The coatings typically adhere well to the platinum wire.

The following examples are provided by way of illustration and are not intended to limit the invention in any way.

EXAMPLE 1

A 100 $\mu$m platinum wire was coated by pulling it through a molten superconducting material of the composition of $Bi_2Sr_2CaCu_2O_{8-\delta}$ or $Bi_{1.8}Sr_{1.8}Ca_{1.2}Cu_{2.2}O_{8-\delta}$. The source material was prepared from $Bi_2O_3$ (5N8), $CaCO_3$ (3N5), $SrCO_3$ (5N) and CuO (5N) powders. The appropriate amounts were mixed together, finely ground, pressed into a pellet, and sintered for fifteen hours in a air at 780° C. The pellet was then re-ground, re-pressed and sintered under the same conditions. Rod-like pieces were cut out of the pellets. The source material was composed of two rectangular cross-section rods having a groove running along one side. The rods were combined together to form a squared cross-section rod of 1.2×1.2 mm having a hole along its axis. Through this hole, the wire was threaded. The top of the source material rod was then melted using an angular focused laser beam, as described in *Science*, 240, 1642-45 (June 17, 1988). The wire passes through the molten zone formed on top of the source material rod.

After melting the top of the source material, the wire was pulled at a constant speed of 4.6 mm/hr. The molten superconducting material that wet the wire was then pulled with it, then solidified around the wire.

Microprobe analysis of the coating of the 100 $\mu$m wire, grown in the rate of 4.6 mm/hr showed it to consist of four phases: 1) An inner layer of 2-3 $\mu$m in thickness having a large amount of platinum and very little amount of bismuth and probably is not superconducting; 2) an outer phase having the cations ratio of Bi:Sr:Ca:Cu=1.8:2.0.8:2.4 comprising the main phase of the superconducting coating; 3) a light gray phase, mainly as a thin layer between the other two, which is low in calcium and copper and is probably not a very good superconductor; 4) some black spots that are mainly copper oxide with small amounts of the other cations. In the analysis results of this wire, platinum was found. However, a transport measurement showed that this wire also had high temperature superconductivity with transition temperature at 87°K. The onset of the superconductivity is at 90°K and zero resistivity is obtained at 78°K.

A bending test on one of the coated wires showed that the coating adheres well to the platinum wire and at the bending limit would crack rather than peel off.

EXAMPLE 2

A 25 $\mu$m platinum:10% rhodium wire was coated by pulling it through a molten superconductive material of the composition $Bi_2Sr_2CaCu_2O_{8-\delta}$ or $Bi_{1.8}Sr_{1.8}Ca_{1.2}Cu_{2.2}O_{8-\delta}$. The source material was prepared as in Example 1, except that in this case, the wire ran along one side of the source material touching its top. The top was then melted, using the laser system as described above. However, in this case, the heating power on the wire side was higher than the opposite side by moving the source rod out of the center of the beam. That way the molten zone was slanted towards the wire side. At a pull rate of 10 mm/hr. a 2$\mu$m coating formed over the wire.

EXAMPLE 3

A 100 $\mu$m rhodium wire is coated by pulling it at a constant rate of 10 mm/hr through a molten superconducting material of the composition $Bi_2Sr_2CaCu_2O_{8-\delta}$ or $Bi_{1.8}Sr_{1.8}Ca_{1.2}Cu_{2.2}O_{8-\delta}$ as described in Example 1. An 8 $\mu$m coating is formed over the wire having superconducting properties.

We claim:

1. A method for making a flexible superconductive composite wire comprising the steps of:
   (a) drawing a wire of noble metal through a molten material, formed by melting a solid formed by pressing powdered $Bi_2O_3$, $CaCO_3$, $SrCO_3$ and CuO in a ratio of components necessary for forming a Bi-Sr-Ca-Cu-O superconductor, into said solid and sintering at a temperature in the range of 750°-800° C. for 10-20 hours, whereby said wire is coated by said molten material; and
   (b) cooling said coated wire to solidify said molten material to form said superconductive flexible composite wire without need of further annealing.

2. A method according to claim 1 wherein said wire is drawn through said melt at the rate of less than 25 millimeters per hours.

3. A method according to claim 1 wherein said sintering is conducted at a temperature of about 780° C. for about 15 hours.

4. A method according to claim 1 wherein said molten material is formed by heating said solid by focusing radiation thereon from a lasing device while said wire is in contact therewith.

5. A method according to claim 4 wherein said wire is drawn through an orifice in said solid.

6. A method according to claim 4 wherein said wire is drawn along a surface of said solid.

* * * * *